United States Patent [19]

Fujii et al.

[11] Patent Number: 4,491,560

[45] Date of Patent: Jan. 1, 1985

[54] LARGE CRYSTAL GRAINS OR SINGLE CRYSTALS OF MOLYBDENUM AND PROCESS FOR PRODUCTION THEREOF

[75] Inventors: Tadayuki Fujii, Yokohama; Yutaka Hiraoka, Sakura; Ryoji Watanabe, Matsudo, all of Japan

[73] Assignee: National Research Institute for Metals, Tokyo, Japan

[21] Appl. No.: 575,935

[22] Filed: Jan. 31, 1984

[30] Foreign Application Priority Data

Jan. 31, 1983 [JP] Japan ................................. 58-12928

[51] Int. Cl.$^3$ .......................... C22C 27/04; C22F 1/18
[52] U.S. Cl. ................................. 420/429; 148/11.5 F; 148/133; 148/423
[58] Field of Search ..................... 148/423, 11.5 F, 133; 420/429

[56] References Cited

U.S. PATENT DOCUMENTS 1,602,526  10/1926  Gero ................................... 148/423
3,320,036   5/1967  Scruggs ............................... 148/423

OTHER PUBLICATIONS

Chen et al., Journal of Metals, p. 451, Jun. 1951.
Bulychev et al., Fiz. Metal. Metalloved., vol. 27, pp. 107–110, (1969).
Capp et al., Journal of the Less-Common Metals, vol. 40, pp. 9–20, (1975).

*Primary Examiner*—W. Stallard
*Attorney, Agent, or Firm*—Wenderoth, Lind & Ponack

[57] ABSTRACT

Large crystal grains or a single crystal of molybdenum composed of molybdenum and at least one trace element selected from the group consisting of calcium and magnesium, the amount of the trace element being 0.003 to 0.12 atomic percent based on the total amount of the components of the large crystal grains or single crystal, and a process for producing large crystal grains or a single crystal of molybdenum, which comprises working at a temperature of 900° to 1500° C. a polycrystalline material composed of molybdenum and 0.003 to 0.12 atomic percent, based on the total amount of the components of the material, of at least one trace element selected from the group consisting of calcium and magnesium, and thereafter annealing the worked material in a non-oxidizing atmosphere to a temperature of at least 1800° C. but below the melting point of molybdenum.

23 Claims, 1 Drawing Figure

LARGE CRYSTAL GRAINS OR SINGLE CRYSTALS OF MOLYBDENUM AND PROCESS FOR PRODUCTION THEREOF

BACKGROUND OF THE INVENTION

1. Field of the Invention

This invention relates to large crystal grains or a single crystal of molybdenum and a process for production thereof. More specifically, the invention relates to a large crystal grains or a single crystal of molybdenum containing calcium and/or magnesium and a process for production thereof.

2. Description of the Prior Art

Molybdenum has excellent strength at high temperatures and is expected to be useful as a heat resistant material. Heretofore, molybdenum element or its products have been supplied in the form of aggregates of small crystal grains, namely polycrystals. The serious defect of polycrystal molybdenum material is the brittleness of its grain boundary. In particular, its workability below room temperature is extremely poor. At high temperatures, its crystal grains become coarse to cause recrystallization brittleness, and its characteristic properties as a heat-resistant material cannot be fully exhibited. Hence, the molybdenum material has only limited applications. If molybdenum is available as large crystal grains or a single crystal being free from a grain boundary and having any desired large shape, it will not be mechanically broken because of the absence of grain boundary brittleness and can be used until it is worn out. This advantage will greatly enlarge the field of utilization of molybdenum, and it will find extensive use as a material for IC substrates, nuclear reactors, nuclear fusion reactors, heat generating members of usual furnaces, crucibles, electronic component parts, etc. Accordingly, large crystal grains or single crystals of molybdenum free from a grain boundary have been desired.

The article of N. K. Chen et al. entitled "Growth of Molybdenum Single Crystal" (Journal of Metals, June 1951, p. 461) describes a method of growing a single crystal of molybdenum by exerting a stress on pure molybdenum in the form of a wire and then heating it while providing a temperature gradient. But only a part of the wire is converted to a single crystal, and the length of the single crystal is only about 1.5 inches at the largest.

D. K. Bulychev et al. reported the effect of a working method on the recrystallization of molybdenum in the case of using a molybdenum rod ["Anomalous Grain Growth and Formation of Single Crystals on the Annealing of HydroExtruded Molybdenum", Fiz. metal. metalloved., 27 (1969), pp. 107–110]. The size of the resulting single crystal is 7 mm in diameter and 100 mm in length at the largest.

The article of D. J. Capp et al. entitled "The Preparation and Characterization of High-Purity Molybdenum Single Crystals" [Journal of the Less-Common Metals, 40 (1975), pp. 9–20] describes the preparation of high-purity molybdenum single crystals by a combination of electron-beam zone-refining and thermal anneals. They obtained high-purity molybdenum single crystals having a diameter of 10 mm and a length of 150 mm by this method. However, this method can give only a round rod-like product, and a high level of expert skill is required for its production.

The above-cited three references describe the production of single crystals of molybdenum, but fail to describe a method of easily obtaining large crystal grains or single crystals of molybdenum by adding specified amounts of additives.

SUMMARY OF THE INVENTION

It is an object of this invention to provide large crystal grains or a single crystal of molybdenum free from a grain boundary, or shaped articles in any desired shape composed of these large crystal grains or single crystal, and processes for easily obtaining these large crystal grains or single crystals or their shaped articles.

According to this invention, there are provided large crystal grains or a single crystal of molybdenum composed of molybdenum and at least one trace element selected from the group consisting of calcium and magnesium, the amount of the trace element being 0.003 to 0.12 atomic percent based on the total amount of the entire components.

The present invention also provides a shaped article of large crystal grains or a single crystal of molybdenum composed of molybdenum and at least one trace element selected from the group consisting of calcium and magnesium, the amount of the trace element being 0.003 to 0.12 atomic percent based on the total amount of the entire components of the shaped article.

The present invention further provides a process for producing large crystal grains or a single crystal of molybdenum, which comprises working at a temperature of 900° to 1500° C. a polycrystalline material composed of molybdenum and 0.003 to 0.12 atomic percent, based on the total amount of the components of the material, of at least one trace element selected from the group consisting of calcium and magnesium, and thereafter heating the worked material in a non-oxidizing atmosphere to a temperature of at least 1800° C. but below the melting point of molybdenum.

The present invention further provides a process for producing a shaped article of large crystal grains or a single crystal of molybdenum which comprises working at a temperature of 900° to 1500° C. a polycrystalline material composed of molybdenum and 0.003 to 0.12 atomic percent, based on the total amount of the components of the material, of at least one trace element selected from the group consisting of calcium and magnesium, and thereafter heating the worked material in a non-oxidizing atmosphere to a temperature of at least 1800° C. but below the melting point of molybdenum.

BRIEF DESCRIPTION OF THE DRAWING

FIG. 1-(B) is a photograph showing that a plate-like article obtained by annealing a molybdenum plate containing 0.003 atomic percent of calcium and 0.003 atomic percent of magnesium is composed of four large crystals (large crystal grains) of molybdenum having an average grain diameter of at least 5 mm.

FIG. 1-(C) is a photograph showing that a plate-like article obtained by annealing a molybdenum plate containing 0.005 atomic percent of calcium and 0.005 atomic percent of magnesium is composed of a single crystal.

DETAILED DESCRIPTION OF THE PREFERRED EMBODIMENTS

Figure 1:
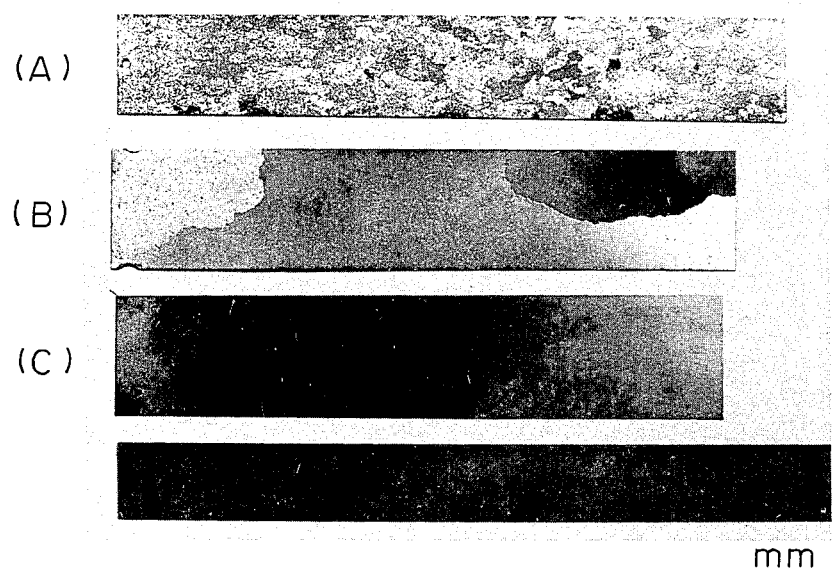
FIG. 1-(A) is a photograph showing that a plate-like article obtained by annealing a molybdenum plate containing 0.100 atomic percent of calcium and 0.100 atomic percent of magnesium is composed of small crystals (fine grains) of molybdenum having an average grain diameter of less than 5 mm.

The present inventors have found that large crystal grains or a single crystal of molybdenum and a large-sized shaped article composed of these large crystal grains or a single crystal can be produced by annealing at high temperatures a polycrystalline material composed of molybdenum and a trace of calcium, magnesium or both. This discovery is surprising since large crystal grains or a single crystal of molybdenum or a large-sized shaped article composed of these large crystal grains or a single crystal cannot be obtained even when a polycrystalline material composed of pure molybdenum and being free from calcium or magnesium is annealed at high temperatures.

The present invention will be described below in detail.

Molybdenum trioxide powder having an average particle diameter of 0.1 to 30 microns, preferably 1 to 10 microns, is mixed with 0.001 to 0.3 atomic percent, preferably 0.003 to 0.12 atomic percent, based on the entire components, of a powder of a calcium compound and/or a magnesium compound, such as calcium oxide or magnesium oxide, in a liquid medium such as an alcohol (e.g., ethanol) to form a slurry-like mixture. Alternatively, such a slurry-like mixture can be prepared by dissolving a compound of calcium and/or magnesium, such as calcium oxide and/or magnesium oxide, in dilute nitric acid, adding ethanol to form an ethanol solution, and adding the resultant solution to a mixture prepared from molybdenum trioxide and ethanol. The slurry-like mixture, with or without drying, is then reduced in an atmosphere of hydrogen in two stages, first at 400° to 600° C. and then at 800° to 1300° C., to form a powdery reduction product. The reduction product is subsequently compressed under a pressure of 1 to 10 tons/cm², and sintered at a temperature of 1600° to 2300° C., preferably 1700° to 2000° C. to produce a sintered body of molybdenum containing calcium and/or magnesium. The above hydrogen reduction may be performed after the pressing step.

The sintered body so obtained is a polycrystalline material.

The above method of preparing the polycrystalline material is a powder metallurgical method. The polycrystalline material can also be prepared by a melting method. According to the melting method, the polycrystalline material can be obtained, for example, by adding a predetermined trace amount of a calcium and/or magnesium component to molybdenum and heat-melting the mixture to form an ingot.

The powder metallurgical method, however, is preferred to the melting method because with the former it is easy to adjust the proportions of the trace elements in molybdenum and to decrease the initial size of the crystal grains.

In the present invention both the sintered body obtained by the powder metallurgical method and the ingot obtained by the melting method can be used as the polycrystalline material.

The polycrystalline material prepared as above is then hot-worked at 300° to 1500° C., preferably 300° to 1200° C., to produce an intermediate shaped article (worked article) such as a plate, rod, wire, square bar or pipe at a work rate of 40 to 95%, preferably 60 to 85%. The intermediate shaped article may be of any desired size depending upon the polycrystalline material.

The work rate is defined by the following formula $$x - y/x \times 100$$

where $x$ is the thickness of the polycrystalline material before working, and $y$ is the thickness of the intermediate article after working.

The intermediate shaped article is annealed in a non-oxidizable atmosphere, for example under a vacuum of less than $10^{-6}$ torr or in a hydrogen or argon atmosphere at a temperature of at least 1800° C. but lower than the melting point of molybdenum for 0.5 to 5 hours, preferably 0.5 to 3 hours, to form a shaped article composed of large crystal grains or a single crystal of molybdenum.

On the other hand, a pure molybdenum polycrystalline material is prepared by performing the two-stage hydrogen reduction, pressing and sintering in the same way as in the above production of sintered body of molybdenum containing calcium and/or magnesium except that molybdenum trioxide powder alone is used. A product obtained by annealing this pure molybdenum polycrystalline material under the same conditions as above is composed of fine crystal grains of molybdenum, and the formation of its large crystal grains or a single crystal is not observed.

The fine crystal grains, as used herein, mean crystal grains having an average grain diameter of less than 5 mm. The large crystal grains mean crystal grains having an average grain diameter of at least 5 mm. The single crystal means that an annealed shaped article is composed wholly of a single crystal.

According to the process of this invention, a large-sized single crystal shaped article of any desired shape such as a plate, rod, wire, square bar or pipe can be easily produced. By increasing the size of the annealing furnace, single crystal shaped articles of the desired size can be produced.

For example, the process of this invention can easily give a plate composed entirely of a single crystal of molybdenum and having a size of 0.1-100 mm × 5-100 mm × 50-1000 mm, and a rod or wire composed entirely of a single cyrstal of molybdenum and having a size of 0.1-100 mm in diameter and 50-1000 mm in length. Plates, rods and wires composed entirely of a single molybdenum crystal and having larger sizes can of course be produced easily by the present invention.

The large crystal grains or single crystal of molybdenum containing a specified amount of calcium and/or magnesium which is obtained by the present invention and shaped articles composed of such large crystal grains or single crystal of molybdenum have excellent mechanical properties, such as ductility and bending workability, at high and low temperatures.

The large crystal grains and single crystal of molybdenum and shaped articles composed of these large crystal grains or single crystal can be used in various fields, for example in IC substrates, nuclear reactors, nuclear fusion reactors, heat-generating members of ordinary furnaces, crucibles, and electronic component parts.

The following Examples illustrate the present invention more specifically.

EXAMPLE 1

Calcium oxide (specical reagent grade) was heated at 1000° C. for 4 hours. A predetermined amount of the calcium oxide was then weighed and dissolved in dilute nitric acid, and ethanol was added to form a 1 g/liter ethanol solution.

3,200 g of molybdenum trioxide having an average particle diameter of 5 microns obtained from Climax Co. was weighed, and 1600 cc of ethanol was added to form a slurry-like mixture. The solution containing a calcium component prepared as above was added to the slurry-like mixture in such an amount that the amount of calcium was 0.003, 0.005, 0.010, 0.030, 0.050, and 0.060 atomic percent, respectively, based on the total amount of the entire components of the mixture. Each of the resulting mixtures was dried at 300° C. until it no longer had an alcoholic smell. The resulting powder was reduced in an atmosphere of hydrogen in two stages, first at 500° C. and then at 1100° C. The reduced powder was compressed under 4t/cm² to form a shaped article. The shaped article was subsequently sintered at 1840° C. to produce a sintered plate-like article having a size of 30 mm×95 mm×50 mm.

The plate-like article was hot-rolled at 1000° to 1200° C. and 300° to 600° C. respectively to a final work rate of 80%. A plate-like article having a size of 2 mm×40 mm×200 mm was cut out from the hot-rolled plate, and annealed at 2300° C. for 1 hour.

For comparison, a sintered molybdenum plate was prepared from pure molybdenum oxide powder alone containing no calcium element by reduction, pressing and sintering in the same way as above, and annealed at 2300° C. for 1 hour.

The growth of the crystal grains of molybdenum was examined on these two annealed plates. The results are shown in Table 1.

TABLE 1

Effect of calcium on the growth of crystal grains in the molybdenum plate

| | Content (atomic %) | | | State of crystals (size) | Annealing temperature (°C.) |
|---|---|---|---|---|---|
| | Ca | Mg | Total | | |
| Invention | 0.003 | 0.000 | 0.003 | Large grains | 2300 |
| | 0.005 | 0.000 | 0.005 | Single crystal | " |
| | 0.010 | 0.000 | 0.010 | " | " |
| | 0.030 | 0.000 | 0.030 | " | " |
| | 0.050 | 0.000 | 0.050 | " | " |
| | 0.060 | 0.000 | 0.060 | Large grains | " |
| Comparison | 0.000 | 0.000 | 0.000 | Fine grains | " |

EXAMPLE 2

Example 1 was repeated except that magnesium was used instead of calcium. The results are summarized in Table 2.

TABLE 2

Effect of magnesium on the growth of crystal grains in the molybdenum plate

| | Content (atomic %) | | | State of crystals (size) | Annealing temperature (°C.) |
|---|---|---|---|---|---|
| | Mg | Ca | Total | | |
| Invention | 0.003 | 0.000 | 0.003 | Large grains | 2300 |
| | 0.005 | 0.000 | 0.005 | Single crystal | " |
| | 0.010 | 0.000 | 0.010 | " | " |
| | 0.030 | 0.000 | 0.030 | " | " |
| | 0.050 | 0.000 | 0.050 | " | " |
| | 0.060 | 0.000 | 0.060 | Large grains | " |
| Comparison | 0.000 | 0.000 | 0.000 | Fine grains | " |

EXAMPLE 3

In the same way as in Example 1, calcium and magnesium were added in the proportions shown in Table 3, and plates of the same size were produced as in Example 1. The plates were each annealed at 2000° C.

TABLE 3

Effect of calcium and magnesium on the growth of crystal grains in the molybdenum plate

| | Content (atomic %) | | | State of crystals (size) | Annealing temperature (°C.) |
|---|---|---|---|---|---|
| | Ca | Mg | Total | | |
| Invention | 0.003 | 0.003 | 0.006 | Large grains | 2000 |
| | 0.005 | 0.005 | 0.010 | Single crystal | " |
| | 0.006 | 0.009 | 0.015 | " | " |
| | 0.012 | 0.011 | 0.023 | " | " |
| | 0.015 | 0.009 | 0.024 | " | " |
| | 0.018 | 0.010 | 0.028 | " | " |
| | 0.024 | 0.040 | 0.064 | " | " |
| | 0.050 | 0.050 | 0.100 | " | " |
| | 0.060 | 0.060 | 0.120 | Large grains | " |
| Comparison | 0.100 | 0.100 | 0.200 | Fine grains | " |

FIG. 1-(A) is a photograph of the plate-like article composed of fine crystal grains of molybdenum containing 0.100 atomic percent of calcium and 0.100 atomic percent of magnesium which was produced by the method of Example 3.

FIG. 1-(B) is as photograph of the plate-like article composed of large crystal grains of molybdenum containing 0.003 atomic percent of calcium and 0.003 atomic percent of magnesium which was produced by the method of Example 3.

FIG. 1-(C) is a photograph of the plate-like article composed of a single crystal of molybdenum containing 0.005 atomic percent of calcium and 0.005 atomic percent of magnesium which was produced by the method of Example 3.

EXAMPLE 4

This example was carried out in order to examine the effect of the thickness of a plate-like article on the growth of crystal grains of molybdenum.

Example 3 was repeated except that a plate-like article having a size of 10 mm×40 mm×200 mm was used instead of the plate-like article having a size of 2 mm×40 mm×200 mm. The results are shown in Table 4.

TABLE 4

Effect of the thickness of a plate-like article on the growth of crystal grains of molybdenum

| | Content (atomic %) | | | State of crystals (size) | Annealing temperature (°C.) |
|---|---|---|---|---|---|
| | Ca | Mg | Total | | |
| Invention | 0.003 | 0.003 | 0.006 | Large grains | 2000 |
| | 0.005 | 0.005 | 0.010 | Single crystal | " |
| | 0.006 | 0.009 | 0.015 | " | " |
| | 0.012 | 0.011 | 0.023 | " | " |
| | 0.015 | 0.009 | 0.024 | " | " |
| | 0.018 | 0.010 | 0.028 | " | " |
| | 0.024 | 0.040 | 0.064 | " | " |
| | 0.050 | 0.050 | 0.100 | " | " |
| | 0.060 | 0.060 | 0.120 | Large grains | " |
| Comparison | 0.100 | 0.100 | 0.200 | Fine grains | " |

It is seen from Tables 3 and 4 that a plate composed of large crystal grains or a single crystal of molybdenum can be obtained even when the thickness of the sintered plate-like article is increased to five times, i.e. from 2 mm×40 mm×200 mm (Example 3) to 10 mm×40 mm×200 mm (Example 4).

EXAMPLE 5

A solution containing a calcium component and a solution containing a magnesium component were prepared by heating calcium oxide (special reagent grade) and magnesium oxide (special reagent grade) each at 1000° C. Predetermined amounts of these materials were then weighed and each dissolved in dilute nitric acid. Ethanol was then added to prepare 1 g/liter ethanol solutions containing these components respectively.

Ethanol was added to molybdenum trioxide powder having an average particle diameter of 5 microns obtained from Climax Co. to form a slurry. The above predetermined amounts of the solutions containing calcium and magnesium components were added to the slurry. The resulting mixture was dried at 300° C. until it no longer had an alcoholic smell. The resulting powder was reduced in an atmosphere of hydrogen in two stages, first at 500° C. and then at 1100° C. The reduced powder was compressed under 4t/cm² to form a shaped article in the form of a square bar. Subsequently, the shaped article was heated at 1840° C. for 1 hour by directly passing a current through it to produce a sintered square bar having a size of 40 mm×40 mm×300 mm. The sintered bar was then forged at 1000° C. and swaged at 600° C. to form a round rod having a final diameter of 25 mm. A round rod having a size of 25 mm in diameter and 200 mm in length was cut out from the resulting rod. The round rod was then annealed at 2000° C. for 2 hours.

For comparison, a round rod was produced in the same way as above from pure molybdenum oxide powder containing no calcium and magnesium, and annealed at 2000° C. for 2 hours The resulting annealed round rods were each examined for the growth of molybdenum crystal grains.

The results are summarized in Table 5.

TABLE 5

Effect of calcium and magnesium on the growth of crystal grains in the molybdenum round rod

|  | Content (atomic %) | | | State of crystals (size) | Annealing temperature (°C.) |
|---|---|---|---|---|---|
|  | Ca | Mg | Total |  |  |
| Invention | 0.003 | 0.003 | 0.006 | Large grains | 2000 |
|  | 0.005 | 0.005 | 0.010 | Single crystal | " |
|  | 0.006 | 0.009 | 0.015 | " | " |
|  | 0.012 | 0.011 | 0.023 | " | " |
|  | 0.015 | 0.009 | 0.024 | " | " |
|  | 0.018 | 0.010 | 0.028 | " | " |
|  | 0.024 | 0.040 | 0.064 | " | " |
|  | 0.050 | 0.050 | 0.100 | " | " |
|  | 0.060 | 0.060 | 0.120 | Large grains | " |
| Comparison | 0.100 | 0.100 | 0.200 | Fine grains | " |

It is seen from Table 5 that as in the production of plates (Examples 1 to 4), a round rod composed of large crystal grains or a single crystal of molybdenum can be easily obtained. The results shown in Tables 1 to 5 demonstrate that by working and then annealing at high temperatures polycrystalline molybdenum materials containing the amounts specified in this invention of calcium and/or magnesium, shaped articles composed of large crystal grains or a single crystal of molybdenum can be easily produced.

What is claimed is:

1. Large crystal grains or a single crystal of molybdenum composed of molybdenum and at least one trace element selected from the group consisting of calcium and magnesium, the amount of the trace element being 0.003 to 0.12 atomic percent based on the total amount of the components of the large crystal grains or single crystal.

2. A shaped article of large crystal grains or a single crystal of molybdenum composed of molybdenum and at least one trace element selected from the group consisting of calcium and magnesium, the amount of the trace element being 0.003 to 0.12 atomic percent based on the total amount of the components of the article.

3. The shaped article of claim 2 which is in the form of a plate, rod, wire, square bar or pipe.

4. A process for producing large crystal grains or a single crystal of molybdenum, which comprises working at a temperature of 900° to 1500° C. a polycrystalline material composed of molybdenum and 0.003 to 0.12 atomic percent, based on the total amount of the components of the material, of at least one trace element selected from the group consisting of calcium and magnesium, and thereafter annealing the worked material in a non-oxidizing atmosphere to a temperature of at least 1800° C. but below the melting point of molybdenum.

5. A process for producing a shaped article of large crystal grains or a single crystal of molybdenum which comprises working at a temperature of 900° to 1500° C. a polycrystalline material composed of molybdenum and 0.003 to 0.12 atomic percent, based on the total amount of the components of the material, of at least one trace element selected from the group consisting of calcium and magnesium, and thereafter annealing the worked material in a non-oxidizing atmosphere to a temperature of at least 1800° C. but below the melting point of molybdenum.

6. The process of claim 4 wherein the crystals constituting the polycrystalline material have an average particle diameter of not more than 100 microns.

7. The process of claim 4 wherein the polycrystalline material is hot-worked at 1000° to 1200° C. and then hot-worked at 300° to 600° C.

8. The process of claim 4 wherein the non-oxidizing atmosphere is a vacuum having a degree of vacuum of less than $10^{-6}$ torr.

9. The process of claim 4 wherein the polycrytalline material is annealed at a temperature of 1900° to 2400° C.

10. The process of claim 4 wherein the polycrystalline material is annealed for 0.5 to 2 hours.

11. The process of claim 4 wherein the polycrystalline material is a sintered body obtained by powder metallurgy.

12. The process of claim 4 wherein the polycrystalline material is obtained by mixing molybdenum trioxide powder having an average particle diameter of 1 to 10 microns with a powder of the trace element in the form of an oxide in an amount of 0.003 to 0.12 atomic percent based on the total amount of the entire components of the material in a liquid medium, drying the mixture, reducing it in an atmosphere of hydrogen, compressing the reduced product under a pressure of 1 to 10 tons/cm², and then sintering the compressed material at a temperature of 1600° to 2300° C.

13. The process of claim 12 wherein the liquid medium is an alcohol.

14. The process of claim 12 wherein the reduction in hydrogen is carried out in two stages, first at 400° to 600° C. and then at 800° to 1300° C.

15. The process of claim 5 wherein the crystals constituting the polycrystalline material have an average particle diameter of not more than 100 microns.

16. The process of claim 5 wherein the polycrystalline material is hot-worked at 1000° to 1200° C. and then hot-worked at 300° to 600° C.

17. The process of claim 5 wherein the non-oxidizing atmosphere is a vacuum having a degree of vacuum of less than $10^{-6}$ torr.

18. The process of claim 5 wherein the polycrystalline material is annealed at a temperature of 1900° to 2400° C.

19. The process of claim 5 wherein the polycrystalline material is annealed for 0.5 to 2 hours.

20. The process of claim 5 wherein the polycrystalline material is a sintered body obtained by powder metallurgy.

21. The process of claim 5 wherein the polycrystalline material is obtained by mixing molybdenum trioxide powder having an average particle diameter of 1 to 10 microns with a powder of the trace element in the form of an oxide in an amount of 0.003 to 0.12 atomic percent based on the total amount of the entire components of the material in a liquid medium, drying the mixture, reducing it in an atmosphere of hydrogen, compressing the reduced product under a pressure of 1 to 10 tons/cm$^2$, and then sintering the compressed material at a temperature of 1600° to 2300° C.

22. The process of claim 21 wherein the liquid medium is an alcohol.

23. The process of claim 21 wherein the reduction in hydrogen is carried out in two stages, first at 400° to 600° C. and then at 800° to 1300° C.

* * * * *